United States Patent
Kim et al.

(10) Patent No.: US 12,377,755 B2
(45) Date of Patent: Aug. 5, 2025

(54) BATTERY SYSTEM, ELECTRIC VEHICLE INCLUDING THE SAME, AND ELECTRIC VEHICLE

(71) Applicant: LG ENERGY SOLUTION, LTD., Seoul (KR)

(72) Inventors: Uiseong Kim, Daejeon (KR); Kangjin Choi, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/037,166

(22) PCT Filed: Jul. 12, 2022

(86) PCT No.: PCT/KR2022/010089
§ 371 (c)(1),
(2) Date: May 16, 2023

(87) PCT Pub. No.: WO2023/120847
PCT Pub. Date: Jun. 29, 2023

(65) Prior Publication Data
US 2024/0359592 A1   Oct. 31, 2024

(30) Foreign Application Priority Data

Dec. 24, 2021  (KR) .......................... 10-2021-0187700

(51) Int. Cl.
*B60L 58/18*    (2019.01)
*G01R 31/382*   (2019.01)
(Continued)

(52) U.S. Cl.
CPC ............ *B60L 58/18* (2019.02); *G01R 31/382* (2019.01); *H01M 10/425* (2013.01);
(Continued)

(58) Field of Classification Search
CPC ................ B60L 58/18; B60L 2210/10; B60L 2240/545; B60L 2240/547; G01R 31/382;
(Continued)

(56) References Cited

U.S. PATENT DOCUMENTS 5,781,013 A      7/1998  Takahashi
2005/0141154 A1* 6/2005  Consadori ............. B60R 16/023
                                                      361/62
(Continued)

FOREIGN PATENT DOCUMENTS

JP    8-126104 A    5/1996
JP    8-140208 A    5/1996
(Continued)

OTHER PUBLICATIONS

English translation of KR 2013 0047064, May 8, 2013, downloaded from https://worldwide.espacenet.com, Nov. 26, 2024. (Year: 2013).*

(Continued)

*Primary Examiner* — Hal Kaplan
(74) *Attorney, Agent, or Firm* — Birch, Stewart, Kolasch & Birch, LLP

(57) ABSTRACT

Discussed is a battery system applied to an electric vehicle. The battery system can include: a battery pack including a plurality of battery cells; a battery management system configured to obtain information on the battery pack, and manage the battery pack based on the obtained information; and a battery black box configured to, while the electric vehicle is turned off, supply a power voltage to the battery management system, and store battery pack management information generated by the battery management system. The battery pack management information may include information on at least one of a plurality of cell voltage of (Continued)

the plurality of battery cells, a current and a temperature of the battery pack, and an insulating resistance of the battery pack.

17 Claims, 6 Drawing Sheets

(51) Int. Cl.
*H01M 10/42* (2006.01)
*H01M 10/44* (2006.01)
*H01M 10/48* (2006.01)
*H01M 50/204* (2021.01)
*H01M 50/249* (2021.01)

(52) U.S. Cl.
CPC ......... *H01M 10/44* (2013.01); *H01M 10/482* (2013.01); *H01M 50/204* (2021.01); *H01M 50/249* (2021.01); *B60L 2210/10* (2013.01); *B60L 2240/545* (2013.01); *B60L 2240/547* (2013.01); *H01M 2010/4271* (2013.01); *H01M 2010/4278* (2013.01); *H01M 2220/20* (2013.01)

(58) Field of Classification Search
CPC ............. H01M 50/249; H01M 50/204; H01M 10/425; H01M 10/44; H01M 10/482; H01M 2010/4271; H01M 2010/4278; H01M 2220/20
USPC .................................................. 307/9.1, 10.1
See application file for complete search history.

(56) References Cited

U.S. PATENT DOCUMENTS

| 2010/0315043 | A1 | 12/2010 | Chau |
| 2013/0181680 | A1 | 7/2013 | Chau |
| 2014/0277887 | A1 | 9/2014 | Slattery et al. |
| 2021/0184273 | A1* | 6/2021 | Lee ......................... B60L 58/16 |

FOREIGN PATENT DOCUMENTS

| KR | 10-1210523 B1 | 12/2012 | |
| KR | 10-2013-0015201 A | 2/2013 | |
| KR | 10-2013-0047094 A | 5/2013 | |
| KR | 10-2013-0069001 A | 6/2013 | |
| KR | 10-2013-0087779 A | 8/2013 | |
| KR | 20130087779 A * | 8/2013 | ............ B60L 53/665 |
| KR | 10-2013-0130217 A | 12/2013 | |
| KR | 10-1364036 B1 | 2/2014 | |
| KR | 10-1491366 B1 | 2/2015 | |
| KR | 10-1702461 B1 | 2/2017 | |
| KR | 10-1880762 B1 | 7/2018 | |
| KR | 10-2021-0016797 A | 2/2021 | |
| KR | 10-2252179 B1 | 5/2021 | |
| KR | 10-2314351 B1 | 10/2021 | |
| WO | WO 2010/145230 A1 | 12/2010 | |
| WO | WO-2012132177 A1 * | 10/2012 | .......... B60L 11/1851 |

OTHER PUBLICATIONS

English translation of KR 2013 0087779, Aug. 7, 2013, downloaded from https://worldwide.espacenet.com, Nov. 26, 2024. (Year: 2013).*
English translation of WO 2012132177, Oct. 4, 2012, downloaded from https://patentscope.wipo.int, Nov. 27, 2024. (Year: 2012).*
Extended European Search Report for European Application No. 22911487.1, dated Jun. 7, 2024.

* cited by examiner

BATTERY SYSTEM, ELECTRIC VEHICLE INCLUDING THE SAME, AND ELECTRIC VEHICLE

BACKGROUND OF THE INVENTION

(a) Field of the Invention

This application claims priority to and the benefit of Korean Patent Application No. 10-2021-0187700 filed in the Korean Intellectual Property Office on Dec. 24, 2021, the entire contents of which are incorporated herein by reference.

The present disclosure relates to a battery system, an electric vehicle including the same, and an electric vehicle operating method.

(b) Description of the Related Art

A battery management system (BMS) may monitor a voltage, a current, and a temperature of a battery in real time, and may estimate a battery state based on obtained information. The battery may provide power for driving an electric vehicle. The electric vehicle may include a vehicle in which a driving force of the vehicle is only supplied from a motor, and a vehicle in which an internal combustion engine and the motor supply the driving force.

When the electric vehicle in which a battery is installed is turned off (ignition off), the BMS also enters a power off state in a like way of other electronic controllers (ECU) in the electric vehicle. In general, if a fire is generated to the electric vehicle when the vehicle is turned off, it is impossible to analyze the battery state at the fire generated time when a fire is generated to it.

SUMMARY OF THE INVENTION

The present invention has been made in an effort to provide a device and method for storing a battery state when an electric vehicle is turned off.

An embodiment of the present invention provides a battery system applied to an electric vehicle, the battery system including: a battery pack including a plurality of battery cells; a battery management system configured to obtain information on the battery pack, and manage the battery pack based on the obtained information; and a battery black box configured to, while the electric vehicle is turned off, supply a power voltage to the battery management system, and store battery pack management information generated by the battery management system. The battery pack management information may include information on at least one of a plurality of cell voltages of the plurality of battery cells, a current and a temperature of the battery pack, and an insulating resistance of the battery pack.

The battery black box may include: a communicator configured to receive the battery pack management information; a controller configured to receive the battery pack management information from the communicator and store the battery pack management information in a memory; and a black box battery configured to supply a power voltage to the battery management system while the electric vehicle is turned off.

The black box battery may be charged while the electric vehicle is turned on.

The battery black box may further include a power switch operable to supply an output voltage of the black box battery to the battery management system while the electric vehicle is turned off, and to charge the black box battery while the electric vehicle is turned on.

The communicator may receive starting state information for instructing turning-off or turning-on of the electric vehicle through Controller Area Network (CAN) communication with an electronic controller of the electric vehicle, and the controller may control the power switch according to the starting state information.

The battery management system may include a first communicator configured to transmit the battery pack management information to the battery black box, the battery black box may include a second communicator configured to receive the battery pack management information, and the first communicator and the second communicator may be connected to each other through CAN communication.

Another embodiment of the present invention provides: an auxiliary battery; and a battery system including a battery pack, a battery management system configured to manage the battery pack, and a battery black box configured to, while an electric vehicle is turned off, store battery pack management information. The electric vehicle may further include a switch configured to connect the auxiliary battery and the battery management system while the electric vehicle is turned on, and connect the battery black box and the battery management system while the electric vehicle is turned off.

The battery black box may include a black box battery configured to supply a power voltage to the battery management system while the electric vehicle is turned off, and the battery pack management information may include information on at least one of a plurality of cell voltages of battery cells, a current and a temperature of the battery pack, and insulating resistance of the battery pack.

The electric vehicle may further include a DC-DC converter configured to charge the auxiliary battery and the black box battery while the electric vehicle is turned on.

The battery black box may store the battery pack management information generated by the battery management system while the electric vehicle is turned off.

The battery black box may further include: a communicator configured to receive the battery pack management information; and a controller configured to receive the battery pack management information from the communicator and store the battery pack management information in a memory.

The battery black box may further include a power switch operable to supply an output voltage of the black box battery to the battery management system while the electric vehicle is turned off, and to charge the black box battery while the electric vehicle is turned on.

The communicator may receive starting state information for instructing turning-off or turning-on of the electric vehicle through Controller Area Network (CAN) communication with an electronic controller of the electric vehicle, and the controller may control the power switch according to the starting state information.

The electric vehicle may further include an electronic controller configured to sense turning-on or turning-off of the electric vehicle to generate starting state information, and transmit the starting state information to at least one of the battery management system and the battery black box.

The battery management system may include a first communicator configured to transmit the battery pack management information to the battery black box, the battery black box may include a second communicator configured to receive the battery pack management information, and the first communicator and the second communicator may be connected to each other through CAN communication.

Another embodiment of the present invention provides a method for operating an electric vehicle receiving a power voltage from a battery system including a battery management system managing a battery pack including battery cells. The method may include: allowing a battery black box to supply a power voltage to the battery management system in a starting state of the electric vehicle including the battery system; allowing the battery management system to acquire information on the battery pack and generate battery pack management information; and allowing the battery black box to store the battery pack management information generated by the battery management system. The battery pack management information may include information on at least one of a plurality of cell voltages of the battery cells, a current and a temperature of the battery pack, and an insulating resistance of the battery pack.

The method may further include: charging the black box battery while the electric vehicle is turned on; and allowing an auxiliary battery of the electric vehicle to supply a power voltage to the battery management system while the electric vehicle is turned on.

The present disclosure provides the battery system for storing the battery state after the electric vehicle is turned off, the electric vehicle including the same, and the method for operating an electric vehicle.

BRIEF DESCRIPTION OF THE DRAWINGS

FIG. 5 shows a schematic diagram of an operation of a switch when an electric vehicle is turned on.

DETAILED DESCRIPTION OF THE EMBODIMENTS

Figure 1:
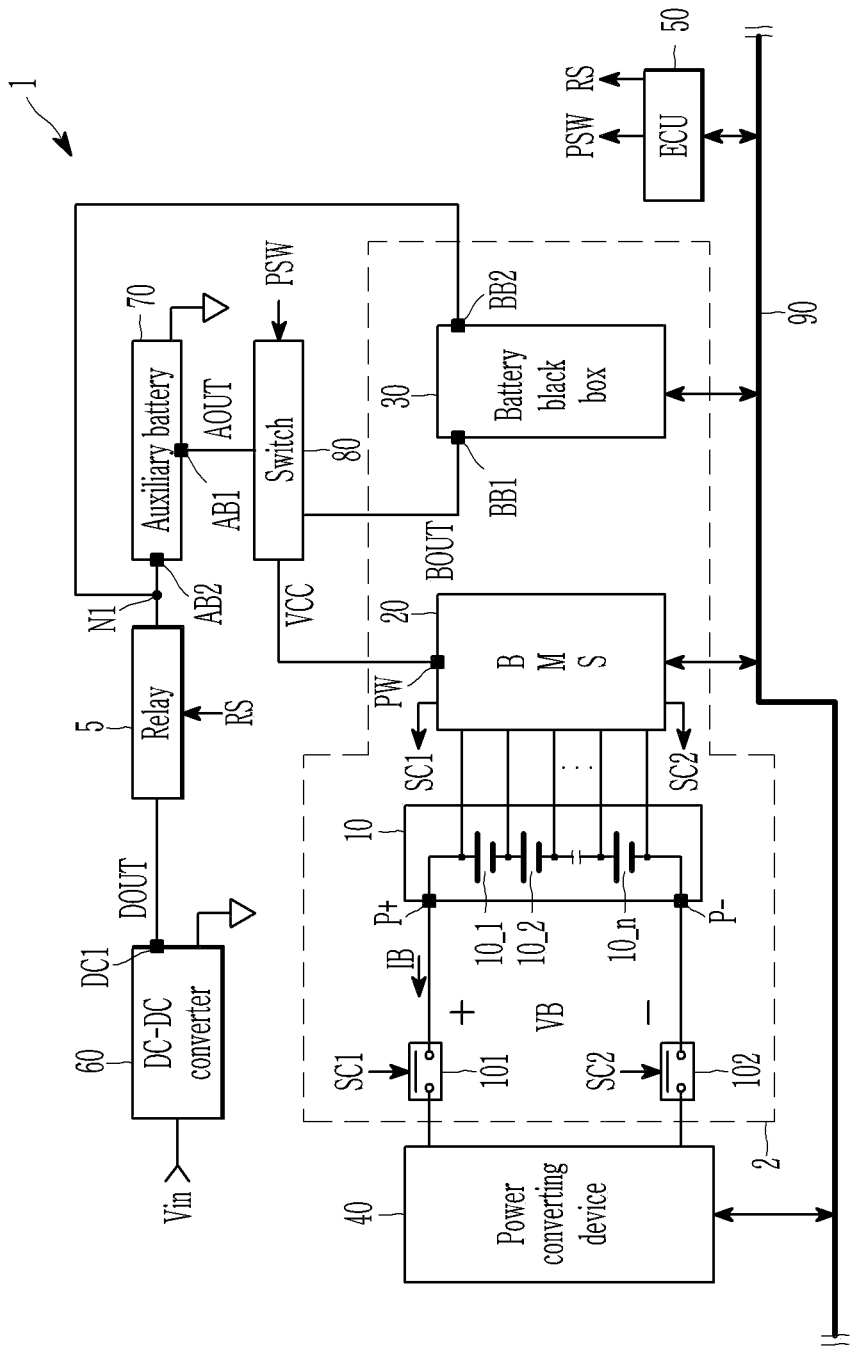
FIG. 1 shows an electric vehicle to which a battery system is applied according to an embodiment.

Embodiments disclosed in the present specification will be described in detail with reference to the accompanying drawings. In the present specification, the same or similar components will be denoted by the same or similar reference numerals, and an overlapped description thereof will be omitted. The terms "module" and "unit" for components used in the following description are used only in order to make the specification easier. Therefore, these terms do not have meanings or roles that distinguish them from each other by themselves. In describing embodiments of the present specification, when it is determined that a detailed description of the well-known art associated with the present invention may obscure the gist of the present invention, it will be omitted. The accompanying drawings are provided only in order to allow embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like will be used only to describe various components, and are not interpreted as limiting these components. The terms are only used to differentiate one component from others.

It will be further understood that terms "comprises" or "have" used in the present specification specify the presence of stated features, numerals, steps, operations, components, parts, or a combination thereof, but do not preclude the presence or addition of one or more other features, numerals, steps, operations, components, parts, or a combination thereof.

From among configurations according to an embodiment, a program that is realized with a set of instructions that are an actualized control algorithm for controlling other configurations may be installed in the configuration for controlling the other configurations in a specific control condition. A control configuration may process input data and stored data according to the installed program and may generate output data. The control configuration may include a non-volatile memory for storing a program and a memory for storing data.

A battery system and an electric vehicle including the same according to an embodiment will now be described with reference to accompanying drawings. The electric vehicle includes a vehicle that is driven with a motor and without an internal combustion engine, and a hybrid vehicle including an internal combustion engine and a motor.

FIG. 1 shows an electric vehicle to which a battery system is applied according to an embodiment.

As shown in FIG. 1, the electric vehicle 1 includes a battery system 2, a power converting device 40, an electronic controller ECU 50, a DC-DC converter 60, an auxiliary battery 70, a switch 80, and a Controller Area Network (CAN) bus line 90.

The power converting device 40 may supply power supplied by a battery pack 10 to a motor (not shown) for providing a driving force to the electric vehicle 1 according to a discharge of the battery pack 10, or may supply it to other electric loads in addition to the motor. Here, the power converting device 40 may receive a battery voltage VB of the battery pack 10, and a current (hereinafter, battery pack current) IB of the battery pack 10 may flow to the power converting device 40. The power converting device 40 may supply the power provided by an alternator (not shown) or the power provided by an external commercial power source to the battery pack 10 to charge the battery pack 10.

An operation of the power converting device 40 may be controlled by the ECU 50. A control instruction of the ECU 50 may be transmitted to the power converting device 40 through the CAN bus line 90. The ECU 50 may request information for control from the power converting device 40, and may receive the information from the power converting device 40.

The ECU 50 may acquire information for controlling the electric vehicle 1, may generate a control instruction based on the acquired information, and may transmit the control instruction to corresponding elements through the CAN bus line 90.

For example, the ECU 50 may sense that the electric vehicle 1 is turned on (ignition on), may transmit the turning on of the starting to at least one of the battery management system BMS 20 and the battery black box 30, and may control the switch 80 to supply a power voltage VCC to the BMS 20 from the auxiliary battery 70. The ECU 50 may sense that the electric vehicle 1 is turned off (ignition off), may transmit the turning off of the starting to at least one of the BMS 20 and the battery black box 30, and may control the switch 80 to supply a power voltage VCC to the BMS 20 from the battery black box 30. In this instance, the ECU 50 may generate a switching control signal PSW for controlling an operation of the switch 80.

When sensing that the starting is turned on, the ECU 50 may shut a relay 5 so that the auxiliary battery 70 may be charged by the DC-DC converter 60. When sensing that the starting is turned off, the ECU 50 may open the relay 5 to block a connection between the DC-DC converter 60 and the auxiliary battery 70. Here, the ECU 50 may generate a relay control signal RS for controlling the relay 5.

The DC-DC converter 60 may supply a power voltage for charging the auxiliary battery 70 and the battery black box 30 by using the input voltage Vin. An output voltage DC1 of the power voltage supplied by the DC-DC converter 60 may have a level that is appropriate for charging the auxiliary battery 70 and the battery black box 30. The input voltage Vin of the DC-DC converter 60 may be a commercial power voltage such as a power voltage source on the wall or may be supplied by the battery system 2.

The relay 5 is connected between an output end DOUT of the DC-DC converter 60 and a node N1, and is opened or shut according to the relay control signal RS. The node N1 may be connected to a charging terminal AB2 connected to a positive electrode of the auxiliary battery 70 and a charging terminal BB2 of the battery black box 30. Therefore, when the relay 5 is shut, the auxiliary battery 70 and the battery black box 30 may be charged by the power voltage supplied by the DC-DC converter 60.

The auxiliary battery 70 may supply a power voltage to an electric load (not shown) of the electric vehicle 1. The load may include various electronic control devices for controlling the operation of the electric vehicle 1, and any types of electric loads for consuming power by flowing the current such as a speed sensor, a switch, a speaker, or a lamp. An output voltage AOUT may be supplied to the electric load and the switch 80 through an output terminal AB1 of the auxiliary battery 70.

The switch 80 may connect the BMS 20 to one of the auxiliary battery 70 and the battery black box 30 according to the switching control signal PSW. When the BMS 20 is connected to the auxiliary battery 70, the output voltage 1 of the auxiliary battery 70 may be supplied to the power terminal PW of the BMS 20 as the power voltage VCC of the BMS 20. When the BMS 20 is connected to the battery black box 30, an output voltage 2 supplied through the output terminal BB1 of the battery black box 30 may be supplied to the power terminal PW of the BMS 20 as the power voltage VCC of the BMS 20.

The battery system 2 includes a battery pack 10, a BMS 20, a battery black box 30, and first and second contactors 101 and 102.

The first contactor 101 is connected between a positive electrode P+ of the battery pack 10 and the power converting device 40, and switches by control of the BMS 20. The second contactor 102 is connected between a negative electrode P− of the battery pack 10 and the power converting device 40, and switches by control of the BMS 20. The BMS 20 may generate switching signals SC1 and SC2 for controlling the switching operations of the first and second contactors 101 and 102 and may supply the same to the first and second contactors 101 and 102.

The battery pack 10 includes a plurality of battery cells 10_1 to 10_n (n is a natural number that is equal to or greater than 2) connected in series.

The BMS 20 are connected to respective ends of a plurality of battery cells 10_1 to 10_n. The BMS 20 may measure cell voltages of the respective battery cells 10_1 to 10_n, may measure a current (hereinafter, a battery pack current) and temperature (hereinafter, a battery pack temperature) of the battery pack 10, and may control and perform cell balancing on the battery cells 10_1 to 10_n.

The BMS 20 may estimate a state of charge (SOC), a state of health (SOH), and a state of power (SOP) of the battery pack 10 based on information on a plurality of cell voltages of a plurality of battery cells 10_1 to 10_n, and the measured battery pack 10. The BMS 20 may control charging and discharging based on the information on the electric vehicle 1 acquired from the ECU 50 and the estimated state of the battery pack 10.

The BMS 20 may measure insulating resistance of the battery pack 10. The insulating resistance of the battery pack 10 represents an insulating state between the battery pack 10 and the ground. Various methods for measuring insulation are known, and the BMS 20 may use one of the known methods for measuring insulation.

The battery black box 30 may supply a power voltage to the BMS 20 when the electric vehicle 1 is turned off, and it may store information on cell voltages, a battery pack current, and a battery pack temperature supplied by the BMS 20.

Figure 2:
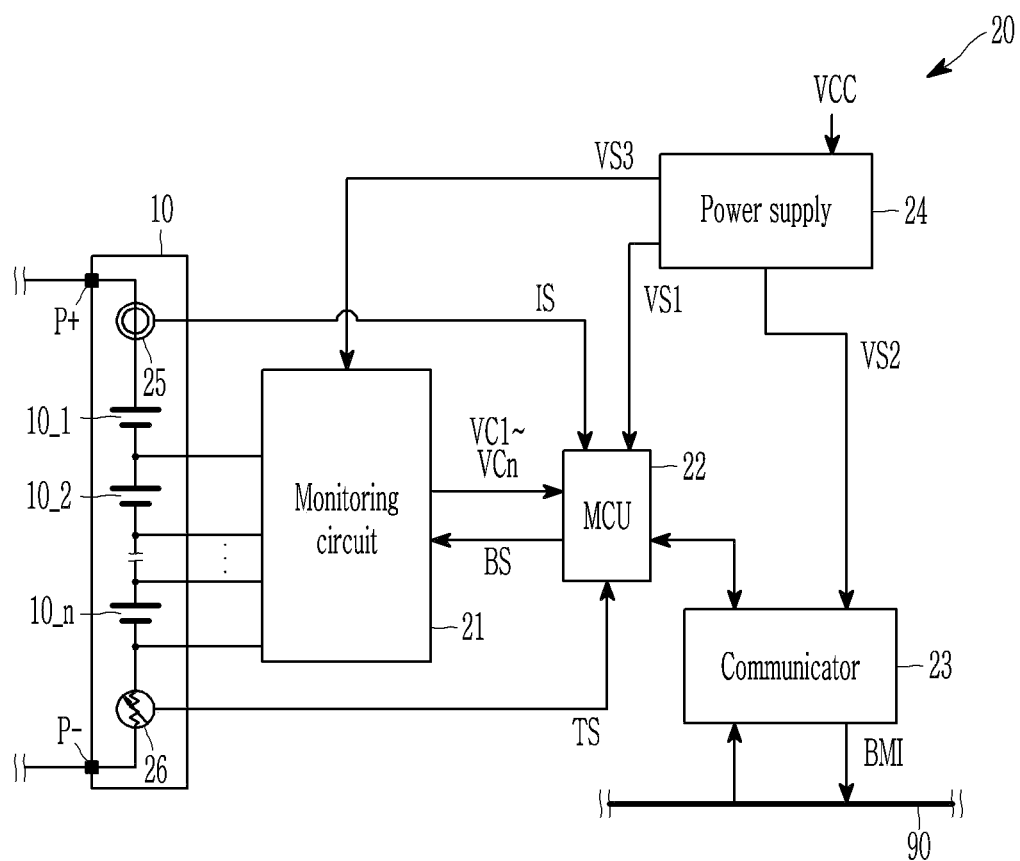
FIG. 2 shows a schematic diagram of an inside of a battery system according to an embodiment.

FIG. 2 shows a schematic diagram of an inside of a battery system according to an embodiment.

As shown in FIG. 2, the BMS 20 includes a monitoring circuit 21, a MCU 22, a communicator 23, and a power supply 24. A current sensor 25 for measuring the battery pack current and a temperature sensor 26 for measuring the battery pack temperature may be positioned in the battery pack 10.

The current sensor 25 may measure the battery pack current, and may transmit information on the measured battery pack current to the MCU 22. FIG. 2 shows that the current sensor 25 is positioned between the battery cell 10_1 and the positive electrode end P+, and the current sensor 25 may be positioned at an arbitrary point in a path of the battery pack current. The current sensor 25 may be realized with a Hall sensor, and may transmit a voltage signal IS (hereinafter, a current detection signal) according to a magnetic field caused by the battery pack current to the MCU 22.

The temperature sensor 26 may measure the battery pack temperature, and may transmit information on the battery pack temperature to the MCU 22. FIG. 2 shows that one temperature sensor 26 is connected between the battery cell 10_n and the negative electrode end P−, and two or more temperature sensors may be positioned between other cells of the battery pack 10. The temperature sensor 26 may be realized with a thermistor, and a voltage TS at respective ends of the temperature sensor 26 (hereinafter, a temperature detection signal) may be transmitted to the MCU 22.

The monitoring circuit 21 may measure a voltage difference between a positive electrode and a negative electrode of the battery cell 10_i (i is one of the natural numbers of 1 to n) for the respective battery cells 10_1 to 10_n, and may generate a battery cell voltage VSi based on the measured voltage difference. The monitoring circuit 21 may transmit cell voltages VC1 to VCn of the battery cells 10_1 to 10_n to the MCU 22. The monitoring circuit 21 may discharge a balancing target cell from among the battery cells 10_1 to 10_n based on the cell balancing control signal BS transmitted from the MCU 22.

The MCU 22 may obtain information on the battery pack current according to the current detection signal, the battery pack temperature according to the temperature detection signal, and a plurality of cell voltages VC1 to VCn to control charging and discharging of the battery pack 10, may generate a cell balancing control signal BS for controlling the cell balancing operation on the battery cells 10_1 to 10_n, and may diagnose defects that may be generated by the battery pack 10. The MCU 22 may turn on the first and second contactors 101 and 102 for charging into the battery pack 10 and discharging from the battery pack 10. When the first and second contactors 101 and 102 are in an On state, the battery pack 10 may be charged or may supply the power voltage to the power converting device 40. The MCU 22 may generate switching signals SC1 and SC2 at a level for turning on the first and second contactors 101 and 102, or may generate switching signals SC1 and SC2 at a level for turning off the first and second contactors 101 and 102.

While the electric vehicle is turned off, the BMS 20 monitors the battery pack 10 for respective predetermined periods (hereinafter, a monitoring period). For the respective monitoring periods, the monitoring circuit 21 may generate a plurality of cell voltages VC1 to VCn and may transmit them to the MCU 22, the current sensor 25 may sense the battery pack current and may transmit the current detection signal IS to the MCU 22, the temperature sensor 26 may sense the battery pack temperature and may transmit the temperature detection signal TS to the MCU 22, and the MCU 22 may measure insulating resistance.

For the respective monitoring periods, the MCU 22 may collect and process information on the cell voltages VC1 to VCn, the battery pack current, the battery pack temperature, and the insulating resistance to generate battery management information BMI, and may transmit it to the communicator 23. Information generated for the respective monitoring periods while the electric vehicle is turned off will be referred to as battery management information BMI. The battery management information BMI may be realized into a CAN data type.

The BMS 20 may not generate the battery management information BMI while the electric vehicle is turned on. While the electric vehicle is turned on, the BMS 20 processes information for managing the battery pack so there is no need to transmit information to an outside. In this instance, when there is an information request on the battery pack from an authenticated external device such as the ECU 50, the BMS 20 may transmit the requested information to the communicator 23.

The communicator 23 may transmit the information received from the CAN bus line 90 to the MCU 22, or may transmit information on the battery pack or the battery management information BMI to the CAN bus line 90 according to control by the MCU 22.

The power supply 24 may convert a power voltage VCC into voltages with levels that are appropriate for respective elements of the BMS 20 and may supply the voltages. For example, the power supply 24 may convert the power voltage VCC into a voltage VS1 at the level that is appropriate for the MCU 22 and may supply it to the MCU 22. The power supply 24 may convert the power voltage VCC into a voltage VS3 at the level that is appropriate for the monitoring circuit 21 and may supply it to the MCU 22. The power supply 24 may convert the power voltage VCC into a voltage VS2 at the level that is appropriate for the communicator 23 and may supply it to the communicator 23.

Figure 3:
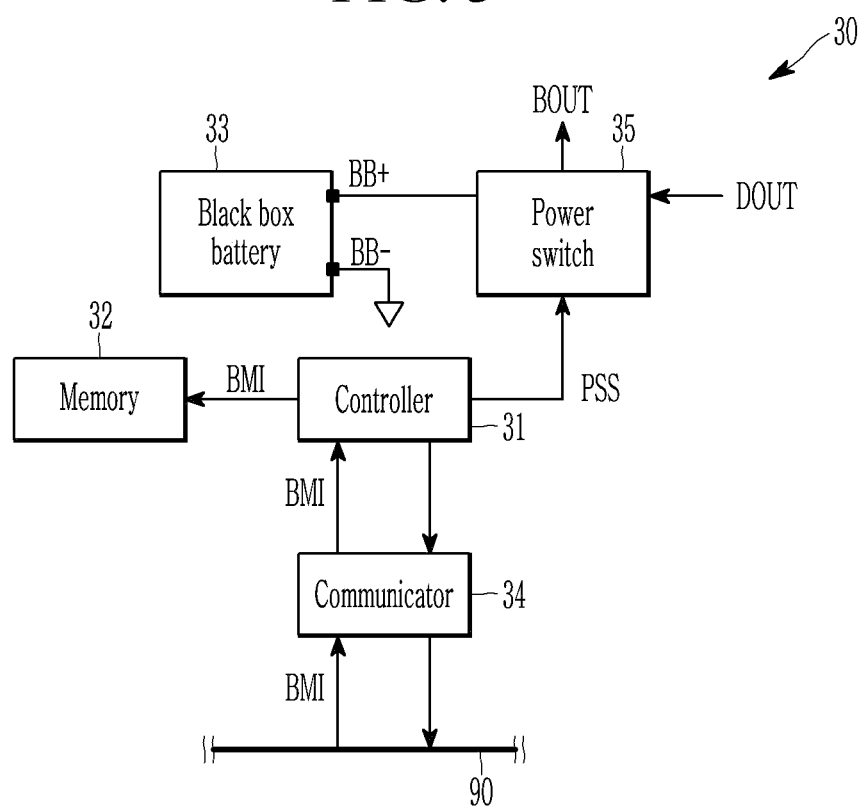
FIG. 3 shows a schematic diagram of battery black box according to an embodiment.

FIG. 3 shows a schematic diagram of battery black box according to an embodiment.

As shown in FIG. 3, the battery black box 30 may include a controller 31, a memory 32, a black box battery 33, a communicator 34, and a power switch 35.

The communicator 34 receives the battery management information BMI from the CAN bus line 90, and transmits the battery management information BMI to the controller 31. The communicator 34 may transmit the information transmitted by the controller 31 to the CAN bus line 90 according to control by the controller 31.

The controller 31 may receive the battery management information BMI and may store it to the memory 32. FIG. 3 shows that the controller 31 and the memory 32 are individually provided, and the controller 31 may include the memory 32. The controller 31 may sense an abnormal event based on the battery management information BMI, and may write information on the abnormal event in the memory 32. For example, when the controller 31 may analyze the battery management information BMI to find a steep cell voltage change, a battery pack temperature change, and an insulating resistance change, the controller 31 may write information on the generated event in the memory 32.

The black box battery 33 is charged by the DC-DC converter 60 while the electric vehicle 1 is turned on, and the black box battery 33 may supply the power voltage to the BMS 20 and may function as the power source of the battery black box 30 while the electric vehicle 1 is turned off.

The power switch 35 may connect the black box battery 33 to one of the DC-DC converter 60 and the switch 80 according to control by the controller 31. The controller 31 may transmit a power switching signal PSS for controlling the power switch 35 to the power switch 35.

A positive electrode BB+ of the black box battery 33 may be connected to the power switch 35, and a negative electrode BB− of the black box battery 33 may be connected to the ground. When the power switch 35 connects the positive electrode BB+ of the black box battery 33 and the DC-DC converter 60 according to control by the controller 31, the black box battery 33 may be charged by the output voltage DOUT from the DC-DC converter 60. When the power switch 35 connects the positive electrode BB+ of the black box battery 33 and the switch 80 according to control by the controller 31, the output voltage BOUT of the black box battery 33 may be transmitted to the switch 80.

The ECU 50 may transmit information on turn-on/off of the starting (hereinafter, starting state information) to the BMS 20 through the CAN bus line 90. When the MCU 22 receives the starting state information, the MCU 22 may transmit this information to the controller 31 in a way that is not the CAN bus line 90 or the CAN communication. The controller 31 may receive starting state information through the communicator 34 of the battery black box 30 in addition to the MCU 22. The battery black box 30 may receive the starting state information in another way. As described above, the ECU 50 may transmit the starting state information to at least one of the BMS 20 and the battery black box 30 through CAN communication.

Figure 4:
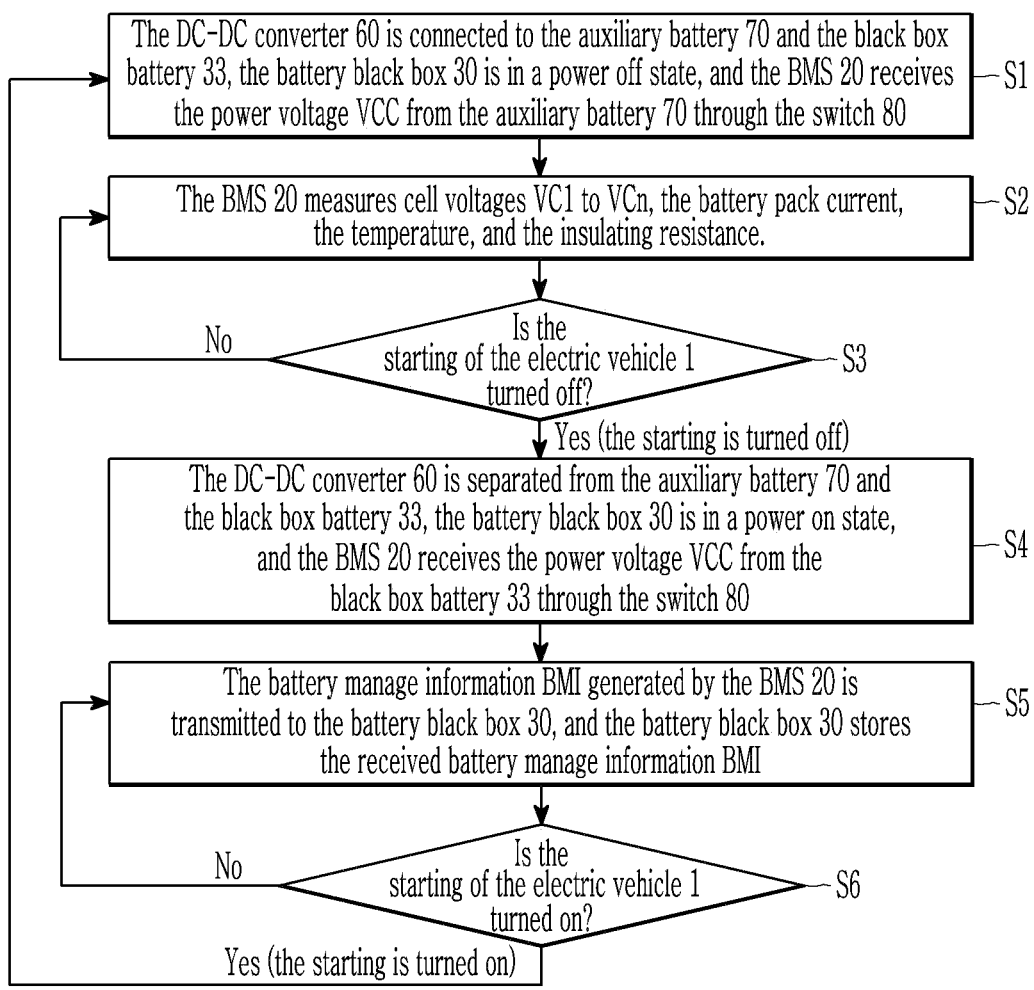
FIG. 4 shows a flowchart of an operation of a battery system according to a starting turning-on or turning-off of an electric vehicle according to an embodiment.

FIG. 4 shows a flowchart of an operation of a battery system according to turning-on or turning-off of an electric vehicle according to an embodiment.

When the electric vehicle is turned on, the ECU 50 senses the turn-on of the starting, and generates corresponding starting state information, a relay control signal RS for controlling the relay 5 by shutting the same, and a switching control signal PSW for connecting the auxiliary battery 70 and the BMS 20. The start state information may be transmitted to at least one of the BMS 20 and the battery black box 30 through the CAN bus line 90.

As the electric vehicle 1 is turned on, the relay 5 may be shut, the DC-DC converter 60 may be connected to the auxiliary battery 70 and the black box battery 33, the battery black box 30 may be in a power off state, and the BMS 20 may receive the power voltage VCC from the auxiliary battery 70 through the switch 80 (S1). The auxiliary battery 70 and the black box battery 33 may be charged by the output voltage DOUT supplied by the DC-DC converter 60.

Figure 5:
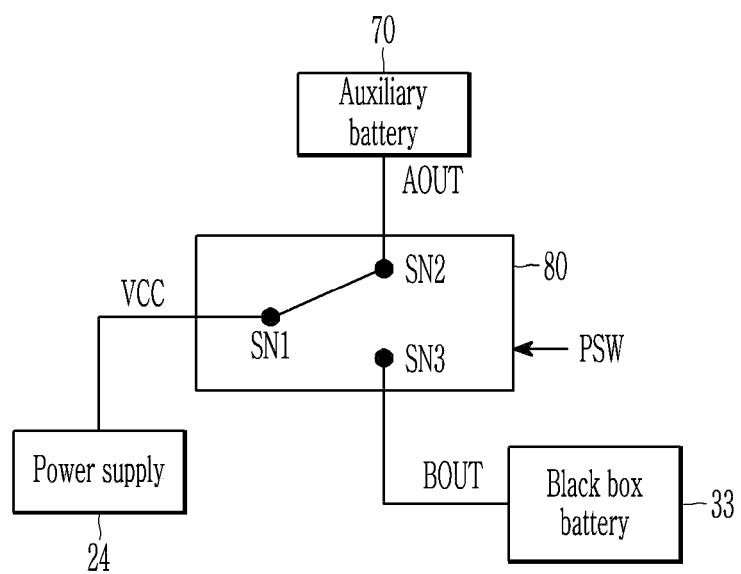

FIG. 5 shows a schematic diagram of an operation of a switch when an electric vehicle is turned on.

As shown in FIG. 5, the switch 80 may connect a node SN2 connected to the auxiliary battery 70 and a node SN1 connected to the power supply 24 of the BMS 20 according to the switching control signal PSW. The output voltage AOUT of the auxiliary battery 70 may then be supplied as the power voltage VCC of the BMS 20.

When the electric vehicle 1 is turned on, the BMS 20 may measure a plurality of cell voltages VC1 to VCn, may measure the battery pack current and temperature, and may measure the insulating resistance (S2).

When the electric vehicle 1 is turned on, the ECU 50 may continuously determine whether the electric vehicle 1 is turned off (S3).

When the starting thereof is found to be turned on according to the determination result of S3, the stage of S2 may be performed. When the starting thereof is found to be turned off according to the determination result of S3, the ECU 50 senses the turn-off of the starting, and generates starting state information, a relay control signal RS for controlling the relay 5 by opening the same, and a switching control signal PSW for connecting the battery black box 30 and the BMS 20. The start state information may be transmitted to at least one of the BMS 20 and the battery black box 30 through the CAN bus line 90.

As the electric vehicle 1 is turned off, the relay 5 may be opened, the DC-DC converter 60 may be separated from the auxiliary battery 70 and the black box battery 33, the battery black box 30 may be in a power on state, and the BMS 20 may receive the power voltage VCC from the black box battery 33 through the switch 80 (S4).

Figure 6:
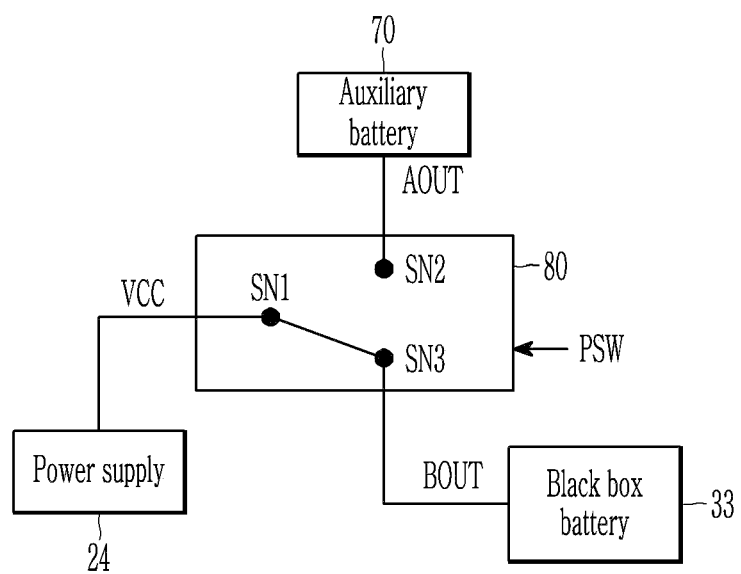
FIG. 6 shows a schematic diagram of an operation of a switch when an electric vehicle is turned off.

FIG. 6 shows a schematic diagram of an operation of a switch when an electric vehicle is turned off.

As shown in FIG. 6, the switch 80 may connect a node SN3 connected to the black box battery 33 and a node SN1 connected to the power supply 24 of the BMS 20 according to a switching control signal PSW. An output voltage BOUT of the black box battery 33 may be supplied as the power voltage VCC of the BMS 20.

When the battery black box 30 is powered on, the battery management information BMI generated by the BMS 20 may be transmitted to the battery black box 30, and the battery black box 30 may store the battery management information BMI (S5).

When the electric vehicle 1 is turned off, the ECU 50 may continuously determine whether the electric vehicle 1 is turned on (S6).

When the starting thereof is found to be turned off according to the determination result of S6, the stage of S5 may be performed. When the starting thereof is found to be turned on according to the determination result of S6, the stage of S1 may be performed.

The black box battery 33 may be manufactured to supply a power voltage to the BMS 20 for at least five days while the starting is turned off. The black box battery 33 may be manufactured to supply a power voltage to the BMS 20 for at least three days in an end of life (EOL) state. For reference, the EOL may represent a state in which the SOH is reduced to 60%.

For example, under conditions in which an operation current of the BMS 20 is 200 mA, the power voltage VCC for operating the BMS 20 is 12 V, an operation current of the battery black box 30 is 200 mA, and the power voltage VCC for operating the battery black box 30 is 12 V, the black box battery 33 may be manufactured to have capacity of 50,000 mAh (125 h*200 mA+125 h*200 mA) and have the output voltage of 12 V so that the BMS 20 and the battery black box 30 may be operated for about 5.2 days (=125 hours).

The memory 32 may be manufactured to store battery management information (CAN data) for at least last one day with respect to the present time. The controller 31 may write battery management information in the memory 32 by erasing data starting from the oldest data from among the data stored in the memory 32 and rewriting new data therein.

A case of the battery black box 30 may be made of a material that is strong against heat such as titanium.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A battery system applied to an electric vehicle, the battery system comprising:
  a battery pack including a plurality of battery cells;
  a battery management system configured to obtain information on the battery pack, and manage the battery pack based on the obtained information; and
  a battery black box configured to, while the electric vehicle is turned off, supply a power voltage to the battery management system, and store battery pack management information generated by the battery management system, the battery black box having a charging terminal connected to an auxiliary battery of the electric vehicle and an output terminal connected to a switch of the electric vehicle,
  wherein the battery pack management information includes information on at least one of a plurality of cell voltage of the plurality of battery cells, a current and a temperature of the battery pack, and an insulating resistance of the battery pack.

2. The battery system of claim 1, wherein the battery black box includes:
  a communicator configured to receive the battery pack management information;
  a controller configured to receive the battery pack management information from the communicator and store the battery pack management information in a memory; and
  a black box battery configured to supply a power voltage to the battery management system while the electric vehicle is turned off.

3. The battery system of claim 2, wherein the black box battery is charged while the electric vehicle is turned on.

4. The battery system of claim 2, wherein the battery black box further includes a power switch operable to supply an output voltage of the black box battery to the battery management system while the electric vehicle is turned off, and to charge the black box battery while the electric vehicle is turned on.

5. The battery system of claim 4, wherein:
the communicator receives starting state information for instructing turning-off or turning-on of the electric vehicle through Controller Area Network (CAN) communication with an electronic controller of the electric vehicle; and
the controller controls the power switch according to the starting state information.

6. The battery system of claim 1, wherein:
the battery management system includes a first communicator configured to transmit the battery pack management information to the battery black box;
the battery black box includes a second communicator configured to receive the battery pack management information; and
the first communicator and the second communicator are connected to each other through Controller Area Network (CAN) communication.

7. The battery system of claim 1, wherein the switch is configured to connect the battery management system to one of the auxiliary battery and the battery black box according to a switching control signal from an electronic controller of the electric vehicle.

8. An electric vehicle comprising:
an auxiliary battery;
a battery system including a battery pack, a battery management system configured to manage the battery pack, and a battery black box configured to, while the electric vehicle is turned off, store battery pack management information; and
a switch configured to connect the auxiliary battery and the battery management system while the electric vehicle is turned on, and connect the battery black box and the battery management system while the electric vehicle is turned off,
wherein the battery black box includes a black box battery configured to supply a power voltage to the battery management system while the electric vehicle is turned off, and
wherein the battery pack management information includes information on at least one of a plurality of cell voltages of battery cells, a current and a temperature of the battery pack, and an insulating resistance of the battery pack.

9. The electric vehicle of claim 8, further comprising a DC-DC (direct current-direct current) converter configured to charge the auxiliary battery and the black box battery while the electric vehicle is turned on.

10. The electric vehicle of claim 8, wherein the battery black box stores the battery pack management information generated by the battery management system while the electric vehicle is turned off.

11. The electric vehicle of claim 10, wherein the battery black box further includes:
a communicator configured to receive the battery pack management information; and a controller configured to receive the battery pack management information from the communicator and store the battery pack management information in a memory.

12. The electric vehicle of claim 11, wherein the battery black box further includes a power switch operable to supply an output voltage of the black box battery to the battery management system while the electric vehicle is turned off, and to charge the black box battery while the electric vehicle is turned on.

13. The electric vehicle of claim 12, wherein:
the communicator receives starting state information for instructing turning-off or turning-on of the electric vehicle through Controller Area Network (CAN) communication with an electronic controller of the electric vehicle; and
the controller controls the power switch according to the starting state information.

14. The electric vehicle of claim 8, further comprising an electronic controller configured to sense turning-on or turning-off of the electric vehicle to generate starting state information, and transmit the starting state information to at least one of the battery management system and the battery black box.

15. The electric vehicle of claim 14, wherein:
the battery management system includes a first communicator configured to transmit the battery pack management information to the battery black box;
the battery black box includes a second communicator configured to receive the battery pack management information; and
the first communicator and the second communicator are connected to each other through Controller Area Network (CAN) communication.

16. A method for operating an electric vehicle receiving a power voltage from a battery system including a battery management system managing a battery pack including battery cells, the method comprising:
allowing a battery black box to supply a power voltage to the battery management system in a starting state of the electric vehicle including the battery system;
allowing the battery management system to acquire information on the battery pack and generate battery pack management information;
allowing the battery black box to store the battery pack management information generated by the battery management system; and
allowing an auxiliary battery of the electric vehicle to supply a power voltage to the battery management system while the electric vehicle is turned on,
wherein the battery pack management information includes information on at least one of a plurality of cell voltages of the battery cells, a current and a temperature of the battery pack, and an insulating resistance of the battery pack.

17. The method of claim 16, further comprising:
charging a black box battery of the battery black box while the electric vehicle is turned on.

* * * * *